United States Patent
Merritt

(10) Patent No.: US 6,243,797 B1
(45) Date of Patent: *Jun. 5, 2001

(54) MULTIPLEXED SEMICONDUCTOR DATA TRANSFER ARRANGEMENT WITH TIMING SIGNAL GENERATOR

(75) Inventor: Todd A. Merritt, Boise, ID (US)

(73) Assignee: Micron Technlogy, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/801,161

(22) Filed: Feb. 18, 1997

(51) Int. Cl.[7] ...................................................... G06F 12/00
(52) U.S. Cl. .......................... 711/167; 711/169; 711/157; 711/100; 711/168
(58) Field of Search ............................... 365/233, 230.08, 365/189.12; 711/104, 167, 100, 101, 102, 105, 111, 150, 154, 157, 168, 169

(56) References Cited

U.S. PATENT DOCUMENTS

| | | | |
|---|---|---|---|
| 4,961,169 | * 10/1990 | Matsumura et al. | 365/189.12 |
| 4,985,643 | 1/1991 | Proebsting | 307/443 |
| 5,261,068 | * 11/1993 | Gaskins et al. | 711/157 |
| 5,325,502 | 6/1994 | McLaury | 395/425 |
| 5,349,566 | 9/1994 | Merritt et al. | 365/233.5 |
| 5,384,750 | * 1/1995 | Lee | 365/233 |
| 5,430,687 | * 7/1995 | Hung et al. | 365/230.08 |
| 5,544,124 | * 8/1996 | Zagar et al. | 365/230.08 |
| 5,587,961 | * 12/1996 | Wright et al. | 365/233 |

OTHER PUBLICATIONS

"Micron 4 Meg X 4/2 Meg X 8 SDRAM", *Micron Synchronous DRAM Data Book*, Micron Technology, Inc., pp. 1–44, (Rev. Feb. 1997).

"Wave–pipelining: Is it Practical?",*1994 IEEE International Symposium on Circuits and Systems*, vol. 4 of 6 VLSI, pp. 163, (164 is blank, not included and 165–166, (May 30–Jun. 2, 1994).

(List continued on next page.)

Primary Examiner—John W. Cabeca
Assistant Examiner—Matthew D. Anderson
(74) Attorney, Agent, or Firm—Schwegman, Lundberg, Woessner & Kluth, P.A.

(57) ABSTRACT

A multiplexing arrangement for transferring data retrieved from a memory array to data outputs of a semiconductor memory, including a multiplexing circuit that is responsive to latency select signals to cause data retrieved sequentially from the memory array to be loaded into and read from data latch circuits of a data output register in a sequence that establishes a known delay between the time that data is retrieved from the memory array and stored in the data output register and the time that the data is read from the data output register. The delay allows data to be held in the data output register when the data is available and to be passed to the data outputs of the memory when desired. Also described is a multi-phase timing signal generator that includes a multi-stage shift register connected for operation as a recirculating shift register, a drive circuit responsive to system clock pulses for advancing a bit pattern through the shift register, and an output circuit for logically combining signals provided at outputs of the shift register as the bit pattern is advanced through the shift register to produce sequential timing signals.

20 Claims, 7 Drawing Sheets

OTHER PUBLICATIONS

Fujiwara, et al., "A 200MHz 16Mbit Synchronous DRAM with Block Access Mode", *1994 Symposium on VLSI Circuits—Digest of Technical Papers*, IEEE Cat. No. 94Ch3434–8, pp. 79–80, (Jun. 9–11, 1994).

Takai, et al., "250 Mbyte/sec Synchronous DRAM Using a 3–Stage–Pipelined Architecture", *1993 Symposium on VLSI Circuits—Digest of Technical Paper*, IEEE Cat. No. 93 CH 3304–3, pp. 59–60, (May 19–21, 1993).

Wong, et al., "A Bipolar Population Counter Using Wave Pipelining to Achieve 2.5x Normal Clock Frequency", *1992 IEEE International Solid–State Circuits Conference—Digest of Technical Papers*, First Edition—IEEE Cat. No. 92CH3128–6, pp. 56–57, (Feb., 1992).

Yoo, et al., "A 150MHz 8–Banks 256M Synchronous DRAM with Wave Pipelining Methods", *1995 IEEE International Solid–State Circuits Conference*, ISSCC95/Session 14—Paper FA 14.4, pp. 250, (1995).

* cited by examiner

MULTIPLEXED SEMICONDUCTOR DATA TRANSFER ARRANGEMENT WITH TIMING SIGNAL GENERATOR

FIELD OF THE INVENTION

The present invention relates to semiconductor memory devices, and in particular, the invention relates to a multiplexed data transfer system and method for controlling the transfer of data from a memory array to the data outputs of an integrated circuit memory device, and for providing programmable latency control in the data transfer operation.

BACKGROUND OF THE INVENTION

As microprocessors have become faster, a need has developed for speeding up memory usage. Various arrangements have been proposed for reducing access time for semiconductor memory devices, such as synchronous dynamic random access memory devices. One of the most common approaches for speeding up memory usage is through the use of pipelining arrangements. In pipelining arrangements, data that is read out of a memory is temporarily held in data registers interposed in the data path between the memory array and output buffers of the input/output circuits of the memory system until needed, allowing the memory to be accessed to read out other data. Many known pipelining arrangements require clocked storage elements in the address buffer, the column switch and in the data output path to maintain synchronization between the data and the system. The need for these clocked storage elements places a restriction on the clock frequency of the system clock.

A further consideration is that pipelining arrangements require internal clock pulses for controlling the sequencing of the data transfer operations. In many instances such internal timing signals are derived from the system clock, typically using counter circuits. The counter circuits divide the system clock pulses to produce a series of internal clock pulses having a predetermined relation to the clock pulse. However, the timing signals that are produced using a counter circuit have an inherent skew because the system clock pulses must ripple through several stages of the counter circuit in producing the internal clock pulses. Moreover, in producing a multi-phase internal clock signal using counter circuits, the output of the counter circuits must be sampled to detect a 1—1 state followed by activation of the reset input of the counter circuit. This results in a time delay and further skews the output signal provided by the counter circuit based internal clock pulse generator. Other clock pulse generating circuits employ inverter circuits for producing sequenced clock pulses. However, the inverter circuits introduce delays that must be compensated for to avoid speed loss.

A synchronous dynamic random access memory employing wave pipelining methods is disclosed in an Article entitled "A 150 MHz 8-Banks 256M Synchronous DRAM with Wave Pipelining Methods" by Hoi-Jun Yoo, et. al, which appeared in the 1995 IEEE International Solid State Circuits Conference, Digest of Technical Papers, pages 250, 251 and 374, Feb. 17, 1995. The memory includes steering circuitry in the data path which transfers data to and from the data output registers according to external latency programming. However, this arrangement requires separate clock signals for data reception from the pipelining path and for data transfer to the output driver.

For the reasons stated above, and for other reasons stated below which will become apparent to those skilled in the art upon reading and understanding the present specification, there is a need in the art for a multiplexed data transfer system and method for controlling the transfer of data retrieved from a memory array to data outputs of a semiconductor memory and for providing programmable latency control in the data transfer operation.

SUMMARY OF THE INVENTION

The present invention provides a multiplexing arrangement for controlling the transfer of data retrieved from a memory array of a semiconductor memory to data outputs of the semiconductor memory and for providing programmable latency control in the data transfer operation. The multiplexing arrangement comprises a data output register which includes a plurality of data storage circuits for storing data that is retrieved from the memory array. A multiplexing circuit is responsive to timing signals produced by a timing signal generator to load data that is retrieved from the memory array into the data storage circuits of the data output register. The timing signals are also used to read the data from the data storage circuits of the data output register for passing the data from the data output register to the data outputs of the semiconductor memory. The multiplexing circuit responds to the timing signals and to a latency select signal to load the data into the data storage circuits in a sequence that establishes a known delay between the time that the data is retrieved from the memory array, and stored in the data output register, and the time that data stored in the data output register is passed to the data outputs. The delay allows data to be held in the data output register when the data is available and to be passed to the data outputs of the semiconductor memory when desired.

In accordance with another aspect of the invention, there is provided a multi-phase timing signal generator which is characterized by fast speed. The timing signal generator comprises a multi-stage shift register connected for operation as a recirculating shift register. The shift register stages store a predetermined bit pattern and a drive circuit, responsive to system clock pulses, advances the bit pattern through the shift register. An output circuit logically combines the signals provided on signal outputs of the shift register stages as the bit pattern is advanced through the shift register to produce a sequence of timing signals. In one embodiment, the drive circuit comprises a pair of two-stage drive shift registers storing complementary bits which change in state in response to system clock pulses, for producing complementary bit pattern advance signals for the multi-stage shift register. This arrangement produces complementary drive signals without the need for inverters, and thus eliminates the delay introduced by inverters.

The timing signal generator is particularly useful for latency control in the transfer of data retrieved from a memory array of a semiconductor memory to data outputs of the semiconductor memory. In such application, the timing signal generator includes a latency control circuit which delays the response of the timing signal generator by one system clock pulse to provide a clock latency of one for the data transfer arrangement.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical and electrical changes may be made without departing from the spirit and scope of the present invention. The following detailed description is, therefore, not to be taken in a limiting sense, and the scope of the present invention is defined only by the appended claims.

Figure 1:
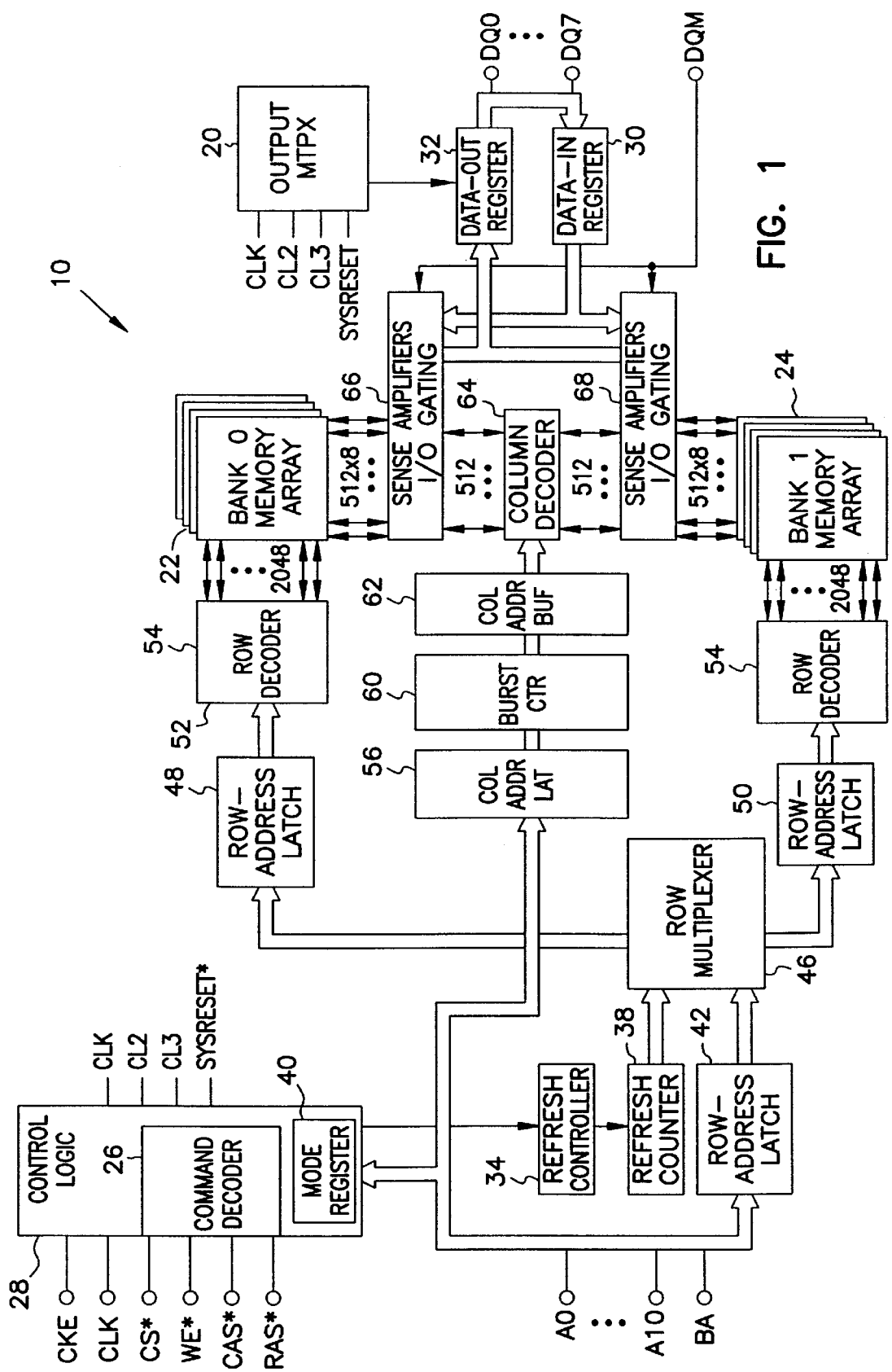
FIG. 1 is a functional block diagram of a synchronous dynamic random access memory incorporating a multi-phase timing signal generator and a data output multiplexing control circuit provided by the invention.

FIG. 1 is a functional block diagram of a synchronous dynamic random access memory (SDRAM) 10 incorporating the data output multiplexing arrangement provided by the invention. In the exemplary embodiment, the SDRAM organized as a dual 1 Meg×8 memory and includes a synchronous interface. Each of the 1 Meg×8 bit banks is organized as 2048 rows by 512 columns by eight bits. Much of the circuitry of the SDRAM 10 is similar to circuitry in known SDRAMS, such as the MT48LC2M8A1 S 2 Meg×8 SDRAM which is commercially available from Micron Technology, Inc. Boise Id., 83707, and which is described in detail in the corresponding Micron Technology, Inc. Functional Specification which is incorporated herein by reference.

SDRAM 10 includes a bank 0 memory array 22 and a bank 1 memory array 24 which both comprise storage cells organized in rows and columns for storing data. In one embodiment of SDRAM 10, each bank memory array comprises eight separate arrays of 2048 rows×512 columns.

A system clock (CLK) signal is provided through a CLK input pin and a clock enable signal (CKE) is provided through a CKE input pin to SDRAM 10. The CLK signal is activated and deactivated based on the state of the CKE signal. All the input and output signals of SDRAM 10, with the exception of the CKE input signal during power down and self refresh modes, are synchronized to the active going edge (the positive going edge in the embodiment illustrated in FIG. 1) of the CLK signal.

A chip select (CS*) input pin inputs a CS* signal which enables, when low, and disables, when high a command decoder 26. Command decoder 26 is included in control logic 28. Command decoder 26 receives control signals including a row address strobe (RAS*) signal on a RAS* pin, column address strobe (CAS*) signal on a CAS* pin, and a write enable (WE*) signal on a WE* pin. Command decoder 26 decodes the RAS*, CAS*, and WE* signals to place control logic 28 in a particular command operation sequence. Control logic 28 controls the various circuitry of SDRAM 10 based on decoded commands such as during controlled reads or writes from or to bank 0 memory array 22 and bank 1 memory array 24. A bank address (BA) signal is provided on a BA input pin to define which bank memory array should be operated on by certain commands issued by control logic 28.

Address inputs bits are provided on input pins A0–A10. As described below, both the row and column address input bits are provided on the address input pins. During write transfer operations, data is supplied to SDRAM 10 via input/output pins (DQ0–DQ7). During read transfer operations, data is clocked out of SDRAM 10 via input/output pins DQ0–DQ7. An input/output mask signal is provided on a DQM input pin to provide control for a data input register 30 and a data output register 32.

Power-up and initialization functions of the SDRAM 10 are conducted in the conventional manner. Moreover, refresh functions of the SDRAM 10 are provided in the known manner employing a refresh controller 34 and a refresh counter 38 to refresh the memory arrays.

A valid ACTIVE command is initiated by control logic 28 with the CS* and RAS* signals low and with the CAS* and WE* signals high on a rising edge of the CLK signal. During the ACTIVE command the state of the BA signal determines which bank memory array to activate and address. During the ACTIVE command, a value representing a row address of the selected bank memory array, as indicated by address bits on input pins A0–A10, is latched in a row address latch 42. The latched row address is provided to a row multiplexer 46 which provides a row address to row address latch 48 to be provided to bank 0 memory array 22 or row address latch 50 to be provided to bank 1 memory array 24, depending on the state of the BA signal. A row decoder 52 decodes the row address provided from row address latch 48 to activate one of the 2,048 lines corresponding to the row address for read or write transfer operations, to thereby activate the corresponding row of storage cells in bank 0 memory array 22. Row decoder 54 similarly decodes the row address in row address latch 50 to activate one of the 2,048 lines to bank 1 memory array 24 corresponding to the row address for read or write transfer operations, to thereby activate the corresponding row of storage cells in bank 1 memory array 24.

A valid READ command is initiated with the CS* and CAS* signals low, and the RAS* and WE* signals high on a rising edge of the CLK signal. The READ command from control logic 28 controls a column address latch 56 which receives address bits A0–A9 and holds a value representing a column address of the bank memory array selected by the BA signal at the time the READ command is initiated. Address pin A10 provides an input path for a command signal which determines whether or not an AUTO-PRECHARGE command is to be initiated automatically after the READ command as is known in the art. The READ command provided from control logic 28 also initiates a burst read cycle by starting a burst counter 60 in the manner known in the art.

A column address buffer 62 receives the output of the burst counter 60 to provide the current count of the column address to a column decoder 64. Column decoder 64 activates eight of the 512×8 lines, provided to sense amplifiers and input/output (I/O) gating circuit 66 and sense amplifiers and I/O gating circuit 68 corresponding to the current column address. Sense amplifiers and I/O gating circuits 66 and 68 operate in a manner known in the art to sense the data stored in the storage cells addressed by the active row decoder line and the active column decoder lines to provide the selected eight bit byte of data from either bank 0 memory array 22 or bank 1 memory array 24 respectively to data output register 32 during a read operation. Data output register 32 provides the selected eight bit byte of data to input/output data outputs at pins DQ0–DQ7.

A valid WRITE command is initiated with the CS*, CAS*, and WE* signals low and the RAS* signal high on the rising edge of the CLK signal. The WRITE command provided from command controller 28 clocks column address latch 56 to receive and hold a value representing a column address of the bank memory array selected by the state of the BA signal at the time the WRITE command is initiated, as indicated by the address provided on address input pins A0–A9. As with the read operation, during the WRITE command, address pin A10 provides the additional feature to select whether or not the AUTO-PRECHARGE command is to be initiated following the WRITE command. Burst counter 60 initiates the burst write cycle. Column address buffer 62 receives the output of the burst counter 60 and provides the current column address to column decoder 64. Column decoder 64 activates eight of the 512×8 lines to sense amplifiers and I/O gating circuits 66 and 68 corresponding to the column address to indicate where the incoming eight bit byte of data is to be stored in either bank 0 memory array 22 or bank 1 memory array 24.

During WRITE command operations, data is provided on input/output pins DQ0–DQ3 to data-in register 30. The eight bit byte of input write data is provided to the selected bank memory array with sense amplifiers and I/O gating circuits 66 or 68 in a manner known in the art based on the activated eight lines corresponding to the current column address.

In accordance with the invention, the transfer of the data read out of the memory arrays 22 and 24 to the data outputs DQ0–DQ7 through the data output register 32 is controlled by data output multiplexer 20. As will be described, the data output multiplexer 20 provides programmable latency control in data transfer operations.

The data that is read from the SDRAM can be latched external to the SDRAM in synchronization with the signal CLK after a predetermined number of CLK cycle delays. This delay arrangement is commonly referred to as clock latency. Once the SDRAM 10 begins to output data in a read cycle, the output drivers will continue to drive the data outputs DQ0–DQ7 without tri-stating the data outputs during CLK high intervals dependent upon the state of the chip select signal (CS*) and the write enable signal (WE*), thus allowing additional time for the memory system to latch the output data.

The SDRAM requires a full clock cycle (high and low transitions) for each memory cycle. In the read cycle, the data that is read out of the one of the memory arrays 22 and 24 is latched into the data output register 32 and is read out subsequently with each rising edge of each clock pulse CLK after the first CLK latency.

Programmability of operating parameters of the synchronous dynamic random access memory, such as burst length, burst type, read latency, operating mode and a write burst mode, is accomplished through the use of a mode register 40 associated with control logic 28 (FIG. 1). The user selects the mode register 40 command to select operating parameters, such as burst length or latency, for the semiconductor SDRAM, as is known in the art. The mode register 40 latches the state of one or more of the address input signals A0–A9, or data signals DQ0–DQ7, upon receipt of a write-CAS*-before-RAS* (WCBR) programming cycle. In the exemplary embodiment, latency control outputs CL2 and CL3 provided by the mode register 40 are used to control the required circuits of the SDRAM. Moreover, the data output multiplexing circuits provide an inherent clock latency of one and are programmable to provide a clock latency of two or a clock latency of three. This basic implementation requires very little additional circuitry to the standard SDRAM.

Output Logic

Figure 2:
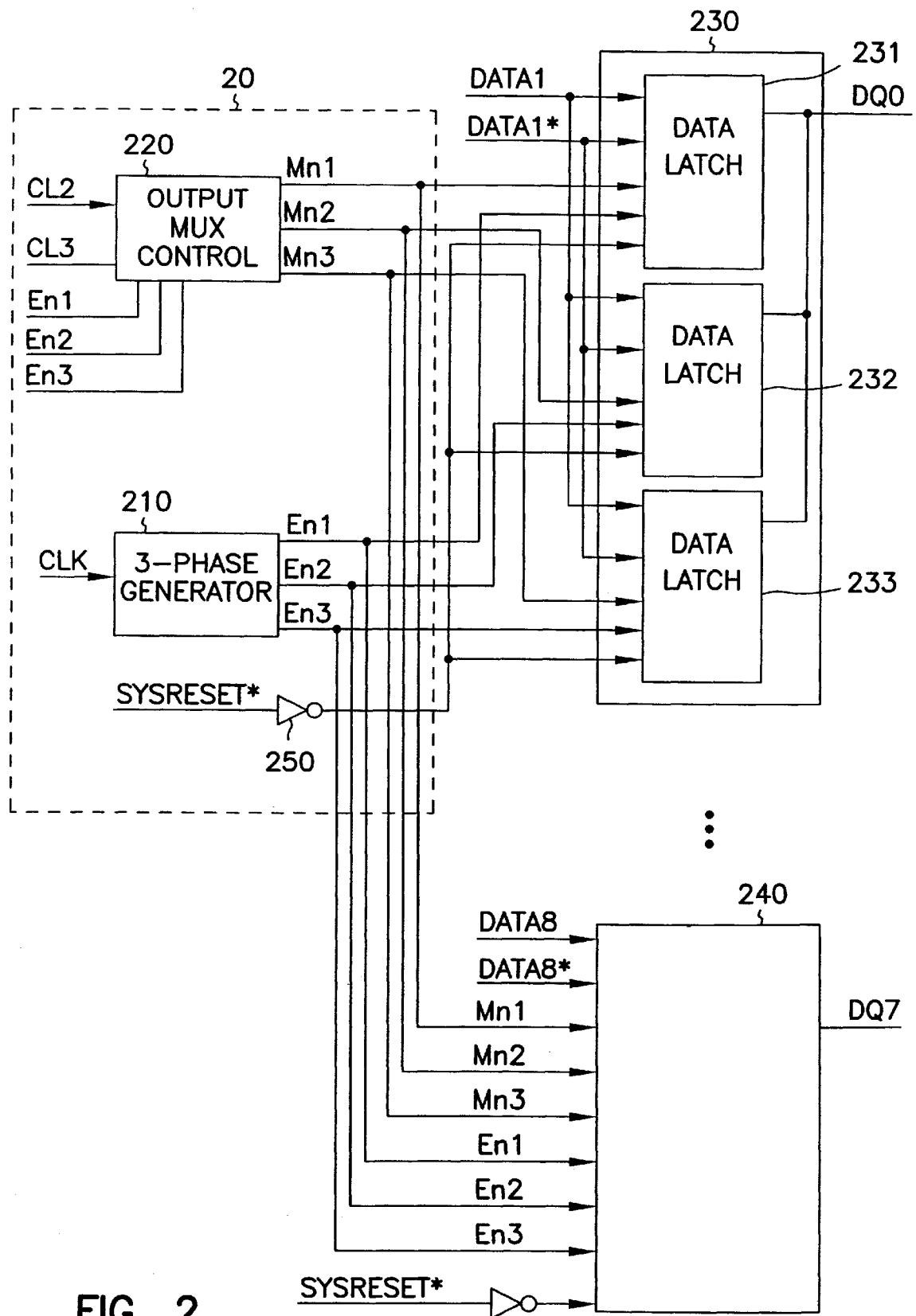
FIG. 2 is a block diagram of a multi-phase timing signal generator and a data output multiplexing control circuit provided by the invention, and which form a portion of the input/output circuits of the synchronous dynamic random access memory of FIG. 1.

FIG. 2 is a block diagram of a portion of the output logic and latches 32 of the SDRAM 10 of FIG. 1, and illustrates a multi-phase timing signal generator 210 and a data output multiplexing control circuit 220 of the data output multiplexer 20 provided by the invention, and data output register circuits 230 and 240 of the data output register of the SDRAM. In the exemplary embodiment, the timing signal generator 210 produces a three-phase timing signal. However, the timing signal generator can be adapted to provide more or less than three timing signals, as a function of application.

The three-phase timing signal generator 210 and the data output multiplexing control circuit 220 control the transfer of data read out of the arrays 22 and 24 and placed on data lines DATA1–DATA8 (and DATA1*–DATA8*) to respective data outputs DQ0–DQ7. The data is temporarily stored in the data output registers prior to transfer to the data outputs. A separate data output register circuit is individually associated with each of the eight data line pairs of the read data bus. FIG. 2 illustrates data output register circuits 230 and 240 which receive the data read out onto read data line pair DATA1 and DATA1*, and read data line pair DATA8 and DATA8*, respectively. Each of the data output register circuits, such as data output register circuit 230, includes three data storage circuits, embodied as latch circuits 231, 232 and 233 the outputs of which are commonly connected to data output DQ0. Similarly, the other seven data output register circuits, such as data output register circuit 240 shown in FIG. 2, also include three data latch circuits which have outputs commonly connected to data outputs DQ1–DQ7, such as data output DQ7 for data output register circuit 240.

Each of the latch circuits, such as latch circuit 231, can comprise a pair of latch circuits, for receiving the complementary signals on read data lines DATA1 and DATA1*, with the outputs of such paired latch circuits being applied to an output driver circuit (not shown) to produce output DQ0. This arrangement allows tri-stating of the output driver, as is known in the art. Alternatively, where such feature is not required, only the true state DATA1 can be applied to the latch circuits 231–233, in which case, the latch circuits 231–233 can each comprise a single latch circuit.

The three-phase timing signal generator 210 derives from the system clock CLK three-phase timing signals En1, En2 and En3 which are used to control the transfer of data through the data output register circuits, such as data output register circuits 230 and 240, of the I/O logic and latch circuits 30 of the semiconductor SDRAM 10. The three-phase timing signals control both the latching of the data into the data output register 32 and the application of the latched data to the data outputs DQ0–DQ7.

As will be shown, the data output multiplexing control circuit 220 controls the enabling of the data latch circuits of the data output register circuits as a function of the latency setting for the arrangement. The data multiplexing arrangement inherently provides a clock latency of one clock cycle as a result of the latency control circuit of the timing signal generator as will be described. However, the data output multiplexing control circuit are programmable to provide a clock latency of two, or a clock latency of three, as a function of application. A clock latency of two is set by activating signal CL2 using the general mode register 40 (FIG. 1). A clock latency of three is set by activating signal CL3 using the general mode register 40. If neither signal CL2 or CL3 is activated, the data output multiplexing control circuit provide a clock latency of one.

Timing Signal Generator

Figure 3:
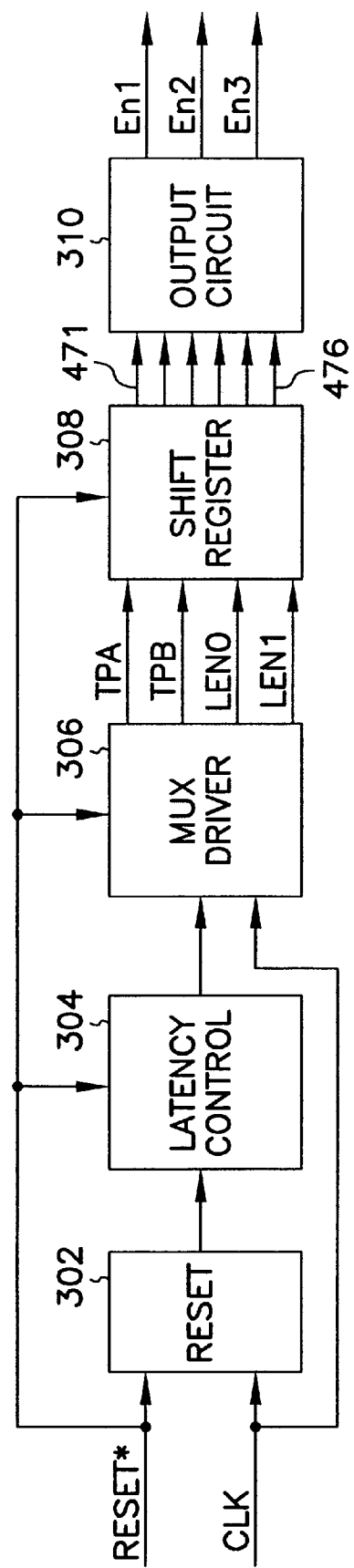
FIG. 3 is a block diagram of the multi-phase timing signal generator provided by the invention.

Referring to FIG. 3, the three-phase timing signal generator 210 includes a reset circuit 302, a latency control circuit 304, a multiplexer and output driver circuit 306, a shift register 308 and an output circuit 310. The timing signals produced by the three-phase timing signal generator are used in controlling the data output multiplexing control circuit 220 (FIG. 2) in loading data into the data output register circuits, such as data output register circuits 230 and 240, shown in FIG. 2, and in reading data from the data output register circuits.

The reset circuit 302 responds to an active low reset signal RESET* to initialize the circuits of the three-phase timing signal generator 210. Digressing, referring to FIG. 6, the reset signal RESET* is produced by a NOR gate 604 and becomes active low state whenever a system reset signal SYSRESET* is produced or when programmed latency is changed, as indicated by the disabling of a NOR gate 602 by either one of its input signals CL2 or CL3 becoming a logic high level, as will be described. The system reset signal SYSRESET* is provided at powerup at the start of a write operation or in response to precharging of both memory banks at the end of a read function.

Referring again to FIG. 3, the latency timing control circuit 304 delays the response of the timing signal generator for one cycle of the external clock following the application of the reset signal. This delay provides the inherent clock latency of one for the data output multiplexing control circuit 220 (FIG. 6) in the exemplary embodiment. It is pointed out that the timing signal generator can be used in other applications in which this delay is not required. In such applications, the latency timing control circuit 304 can be bypassed by connecting the output of the reset circuit 302 directly to the input of the output driver circuit 306. Alternatively, for applications in which the inherent one cycle of clock latency is not required, the timing signal generator can be produced without the latency timing control circuit.

The shift register 308 comprises a six-stage, ring-connected shift register. A known bit pattern is loaded into the shift register 308 in response to load enable signals LEN1 and LEN0 which are provided by the multiplexer and output driver circuit in response to the reset signal RESET*. The shift register is driven by complementary internal timing or shift pulses TPA and TPB which are provided by the multiplexer and output driver circuit 306, shifting the sequence of bits in a wraparound pattern. The pulses TPA and TPB shift the known bit pattern through the shift register stages providing a corresponding change in the signal level provided on the outputs 471–476 of the shift register stages. The signals provided on the outputs 471–476 of the shift register 308 are applied to the output circuit 310. The time-varying bit pattern causes the output circuit 310 to produce enabling signals En1, En2 and En3, in a known sequence, defining the three-phase timing signals.

The use of the shift register 308 in producing the three-phase timing signals in accordance with the invention minimizes time delays through the timing signal generator. In addition, the multiplexer and output driver circuit 306 causes the timing pulses TPA and TPB provided on nodes 446 and 448 (FIG. 4) to change at the same time to provide complementary signals for stepping the bit pattern through the shift register 308, further minimizing delay. In contrast, the use of inverting of shift register outputs to produce complementary shift register clocking signals in the conventional manner, would result in considerable delay in clocking the bit pattern through the shift register.

Figure 4:
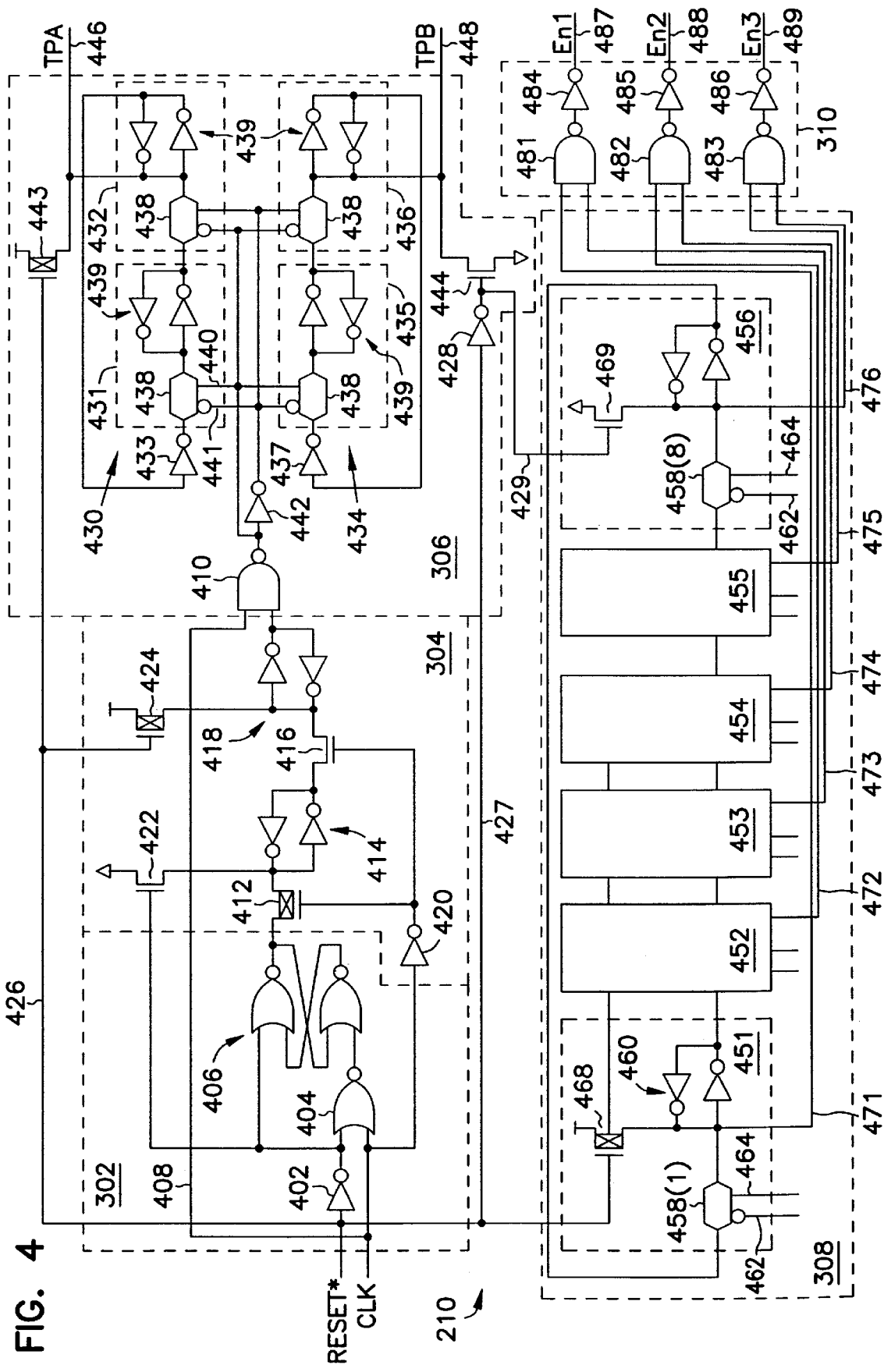
FIG. 4 is a schematic representation of the multi-phase timing signal generator of FIG. 3.

Considering the three-phase timing signal generator 210 in more detail, with reference to FIG. 4, the reset circuit 302 includes an inverter 402, a NOR gate 404 and a NOR latch circuit 406. The external or system clock CLK is connected to one input of the NOR gate 404, the other input of which is connected to receive the complement of the reset signal RESET*. The external clock CLK is also connected to one input of a NAND gate 410 of the multiplexer and output driver circuit 306. The NOR latch circuit 406 is reset in response to each low condition (active state) for the reset signal RESET*.

The latency timing control circuit 304 includes a p-channel pass transistor 412, a latch circuit 414, an n-channel pass transistor 416 and a latch circuit 418 which are connected in series between the output of NOR latch 406 of the reset circuit 302 and a second input of NAND gate 410 of the multiplexer circuit 306. The gate electrodes of the transistors 412 and 416 are commonly connected to the output of an inverter 420 the input of which is connected to receive the external clock CLK. The latency control circuit 304 further includes an n-channel transistor 422 and a p-channel transistor 424 for initializing the latch circuits 414 and 418. Transistor 422 has its gate electrode connected to the output of inverter 402 to load a logic high level, i.e., logic 1, into the latch circuit 414 when the reset signal RESET* and is in its true state. Similarly, transistor 424 has its gate electrode connected to conductor 426 and is responsive to the true state for the reset signal RESET* to load a logic low level, i.e., logic 0, into the latch circuit 418.

The multiplexer and output driver circuit 306 includes a two-stage shift register 430, having an input stage 431 and an output stage 432, the output of which is coupled through an inverter 433 to the input of the input stage 431. The multiplexer and output driver circuit 306 further includes a complementary two-stage shift register 434, having an input stage 435 and an output stage 436, the output of which is coupled through an inverter 437 to the input of the input stage 435. Each of the shift register stages 431, 432, 435 and 436 is formed by a multiplexer circuit 438 and an inverter latch circuit 439. The multiplexer circuit 438 of each shift register stage has complementary control inputs 440 and 441.

The output of NAND gate 410 is connected to inputs 440 of the multiplexers of the input stages 431 and 435 and to inputs 441 of the output stages 432 and 436. In addition, the output of NAND gate 410 is coupled through an inverter 442 to inputs 441 of the multiplexers of the input stages 431 and 435 and to inputs 440 of the output stages 432 and 436.

An output of the latch circuit of shift register output stage 432 is connected to node 446 and to a p-channel transistor 443, the gate electrode of which is connected to conductor 426. The transistor 443 is responsive to a true state for reset signal RESET* to extend Vcc, i.e., logic high level, to load a logic 1 into the latch circuit of the shift register output stage 432 during initialization of the timing signal generator. Similarly, an output of the latch circuit of shift register output stage 436 is connected to node 448 and to an n-channel transistor 444. An inverter 428 connects conductor 427 to the gate electrode of transistor 444 for enabling the transistor 444 to be responsive to the true state for the reset signal RESET* to extend ground, i.e., logic low level, to load a logic 0 into the latch circuit of the shift register output stage 436 during initialization of the timing signal generator. Thus, after initialization of the timing pulse generator, the output stages of the shift registers are set to complementary states.

The shift register 308 comprises six-stages 451–456 with the output 457 of the sixth stage 456 being fed back to the input of the first stage 451. Each of the shift register stages 451–456 is formed by a multiplexer circuit 458 and an inverter latch circuit 460. The multiplexer circuit 458 of each shift register stage has complementary control inputs 462 and 464. The control inputs 462 of the multiplexer circuits 458 of the shift register stages 451–456 are connected to node 446 of the multiplexer and output driver circuit 306 to receive bit pattern advance signal TPA. The control inputs 464 of the multiplexer circuits 458 of the shift register stages 451–456 are connected to node 448 to receive the complementary bit pattern advance signal TPB. Outputs 471–476 of the shift register 308 are taken from the outputs of the multiplexer circuits of each shift register stage as is illustrated for the first shift register stage 451 and the last shift register stage 456 in FIG. 4. Thus, for example, the output 471 of the first stage 451 is taken from the output of multiplexer circuit 458(1) of register stage 451 and the output 476 of the sixth stage 456 is taken from the output of the multiplexer circuit 458(8) of register stage 456.

In the exemplary embodiment, the known bit pattern that is initially stored in the shift register is 111100. However, other bit patterns can be used with appropriate changes made in the output circuits. Also, for producing a three-phase timing signal, the shift register includes six-stages. Other shift register arrangements can be used as a function of the number of timing pulses that are required for a particular application. For example, four or more timing pulses can be produced to provide a clock latency greater than three, with an appropriate change being made in the composition of the data output registers.

The shift register stages 451–454 each includes a reset circuit formed by a p-channel transistor, such as transistor 468 for shift register stage 451. The gates of transistors 468 are connected to conductor 427. Transistors 468, are responsive to the true state of the reset signal RESET* to load a logic 1 level signal into the first through fourth stages 451–454 of the shift register. Similarly, shift register stages 455–456 include reset circuits formed by n-channel transistors, such as transistor 469 for shift register stage 456. The gates of transistors 469 are connected to conductor 429, which, through inverter 428, receives the complement of the reset signal RESET*. Transistors 469 are responsive to the true state of the reset signal RESET*, as inverted by inverter 428, to load a logic 0 level signal into the fifth and sixth stages 455 and 456 of the shift register. Thus, upon initialization in response to the reset signal RESET*, the shift registers stages 451–456 store the bit sequence or bit pattern 111100.

The output circuit 310 includes three two-input NAND gates 481–483. The inputs of NAND gate 481 are connected to the outputs 471 and 474 of the first and fourth stages of the shift register. The output of NAND gate 481 is connected through inverter 484 to the output 487 of the timing signal generator, providing timing signal En1. The inputs of NAND gate 482 are connected to the outputs 472 and 475 of the second and fifth stages of the shift register. The output of NAND gate 482 is connected through inverter 485 to the output 488 of the timing signal generator, providing timing signal En2. The inputs of NAND gate 483 are connected to the outputs 473 and 476 of the third and sixth stages of the shift register. The output of NAND gate 483 is connected through inverter 486 to the output 489 of the timing signal generator, providing timing signal En3.

Operation of the Timing Signal Generator

With continued reference to FIG. 4, the operation of the timing signal generator 210 will now be described. The timing signal generator is initialized in response to the reset signal RESET* being set to its active low state. The signal RESET* is applied through inverter 402 to the NOR latch circuit 406 of the reset circuit 302, resetting the latch circuit. Also, the signal RESET* when applied to conductor 426, enables transistors 424 and 443, and through respective inverters 402 and 428, enables transistors 422 and 444. This causes a logic 0 level bit to be applied to the input of latch 414 and a logic 1 level bit to be applied to the input of latch 418, the output of which inhibits NAND gate 410.

In addition, a logic 1 level bit is loaded into shift register stage 432 so that node 446 is at a logic 1 level and the output of latch 432 is at logic 0. This logic 0 level is fed back through inverter 433 to the input shift register stage 430, providing a logic 1 level thereat. Also, a logic 0 level bit is loaded into shift register stage 436 so that node 448 is at a logic 0 level and the output of latch 436 is at logic 1 level. This logic 1 level bit is fed back through inverter 437 to the input shift register stage 434, providing a logic 0 level thereat. Further, the signal RESET* enables transistors 468 of the shift register 308, loading a logic 1 level bit into stages 451–454 of the shift register. The complement of signal RESET* produced by inverter 428 enables transistors 469 of the shift register 308, loading a logic 0 level into stages 455–456 of the shift register.

Initially, the outputs 471 and 474 of stages 451–454 are at logic 1 levels so that NAND gate 481 is enabled. The logic 0 levels provided at outputs 475 and 476 of shift register stages 455 and 456 disable NAND gates 482 and 483.

When the reset signal RESET* terminates, transistors 422 and 424 are disabled. The output of latch 418 is maintained at a logic low level to maintain NAND gate 410 disabled at this time. Following a reset condition, the signal RESET* is held at a logic 1 level which allows the NOR latch circuit 406 to be set by the first external clock pulse CLK following the reset condition. After a one-clock pulse delay that is introduced by the latency control circuit 304, the logic high level output of the latch 406 is coupled to the NAND gate 410, allowing the NAND gate 410 to follow the system clock.

The first external or system clock pulse CLK, following the reset operation, sets the NOR latch 406, providing a logic 1 level at its input. This clock pulse, through inverter 420, also disables transistor 416 to isolate latch 414 from latch 418 and enables transistor 412 to couple the logic high level output of NOR latch 406 to latch 414. Accordingly, the output of latch 414 becomes a logic low level. Transistor 416 is enabled when this clock pulse terminates and couples the logic low level provided at the output of the latch 414 to latch 418. Consequently, the output of latch 418 becomes a logic high level, allowing the NAND 410 gate to follow subsequent system clock pulses CLK.

Thus, latch circuits 414 and 418 absorb the first external clock pulse, following a reset condition, and then are toggled in response to subsequent external clock pulses. The latency timing control circuit 304 delays the internal timing pulses to provide a delay of one cycle of the external clock following a reset condition before allowing data retrieved from the memory arrays 22 and 24 (FIG. 1) to be loaded into the data output registers.

The second system clock pulse is passed by the NAND gate 410. Each clock pulse passed by gate 410 and the complement of the clock pulse, produced by inverter 442, are applied to the complementary control inputs of the multiplexer circuits 438 of the shift register 306. This causes the logic 1 provided at the shift register input stage 431 to be loaded into the shift register stage 431, which responsively provides a logic 0 level to be stored in the shift register output stage 432. Also, the logic 0 provided at the input of complementary input stage 434 is loaded into the complementary input stage 435, causing a logic 1 to be loaded into output stage 436. This causes the bit pattern advance signal TPA at node 446 to become logic 0 level and simultaneously causes the bit pattern advance signal TPB node 448 to become logic 1 level. Thereafter, the states of signals TPA and TPB on nodes 446 and 448 are switched with each successive system clock pulse.

Each time that the states of the signals on nodes 446 and 448 switch, the bit pattern 111100 that is stored in the shift register 308 is shifted forward one step or stage. Thus, in response to the first system clock pulse following the reset of the timing signal generator, logic 1 level bits are stored in shift register stages 452–455 and logic 0 level bits are stored in shift register stages 451 and 456. Accordingly, NAND gate 481 is disabled, causing timing signal En1 to become a logic low level, and NAND gate 483 is maintained disabled. Also, NAND gate 482 is enabled, causing timing signal En2 to become a logic 1 level.

Figure 5:
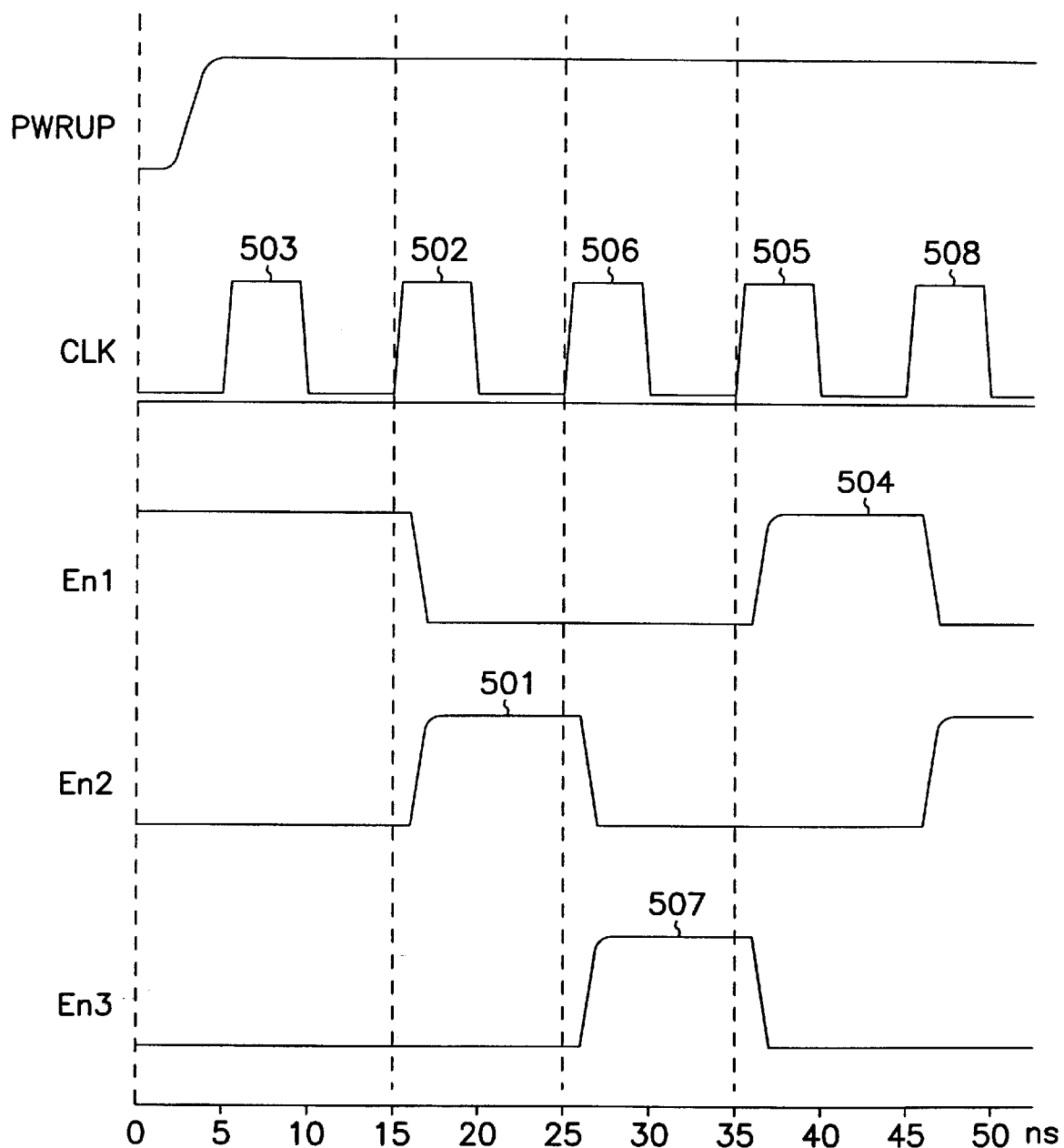
FIG. 5 is a timing diagram showing the relationship between system clock pulse and the timing signals provided by the multi-phase timing signal generator of FIG. 4.

Referring additionally to FIG. 5, the timing signal En2, which is indicated by reference numeral 501, is derived from the second external or system clock pulse, indicated by 502 in line B, following the application of power, represented by the power-up signal PWRUP. Note that a one-clock cycle delay is provided by the latency control circuit 304. Because of this one-clock pulse delay, first occurrence of the timing signal En1, indicated by reference numeral 504, is produced in response to the fourth system clock pulse 505.

In response to the third external clock pulse 506, the shift registers 430 and 434 are toggled causing node 446 to become logic 1 level and causing node 448 to to become a logic 0 level. When nodes 446 and 448 reverse states, the bit pattern stored in the shift register is shifted forward one stage, so that logic 1 level bits are stored in shift register stages 453–456 and logic 0 level bits are stored in shift register stages 451 and 452. Accordingly, NAND gate 482 is disabled, causing timing signal En2 to become a logic low level (FIG. 5) and NAND gate 481 is maintained disabled. Also, NAND gate 483 is enabled, causing timing signal En3 become a logic 1 level as indicated by reference numeral 507 in FIG. 5.

In response to the fourth external timing pulse (indicated by reference numeral 505, in FIG. 5), the shift registers 430 and 434 are toggled level causing node 446 to again become a logic 0 level and node 448 to become a logic 1 level. When nodes 446 and 448 reverse states, the bit pattern stored in the shift register 308 is shifted forward one stage, so that logic 1 level bits are stored in shift register stages 454–456 and 451 and logic 0 level bits are stored in shift register stages 452 and 453. Accordingly, NAND gate 483 is disabled, causing output signal En3 to become a logic low level, and NAND gate 482 is maintained disabled. Also, NAND gate 481 is enabled, causing output signal En1 to become a logic 1 level. The nodes 446 and 448 change state simultaneously with each subsequent system clock pulse in the foregoing manner, producing the signals En1, En2 and En3 in sequence.

Data Output Multiplexing Control Circuit

Figure 6:
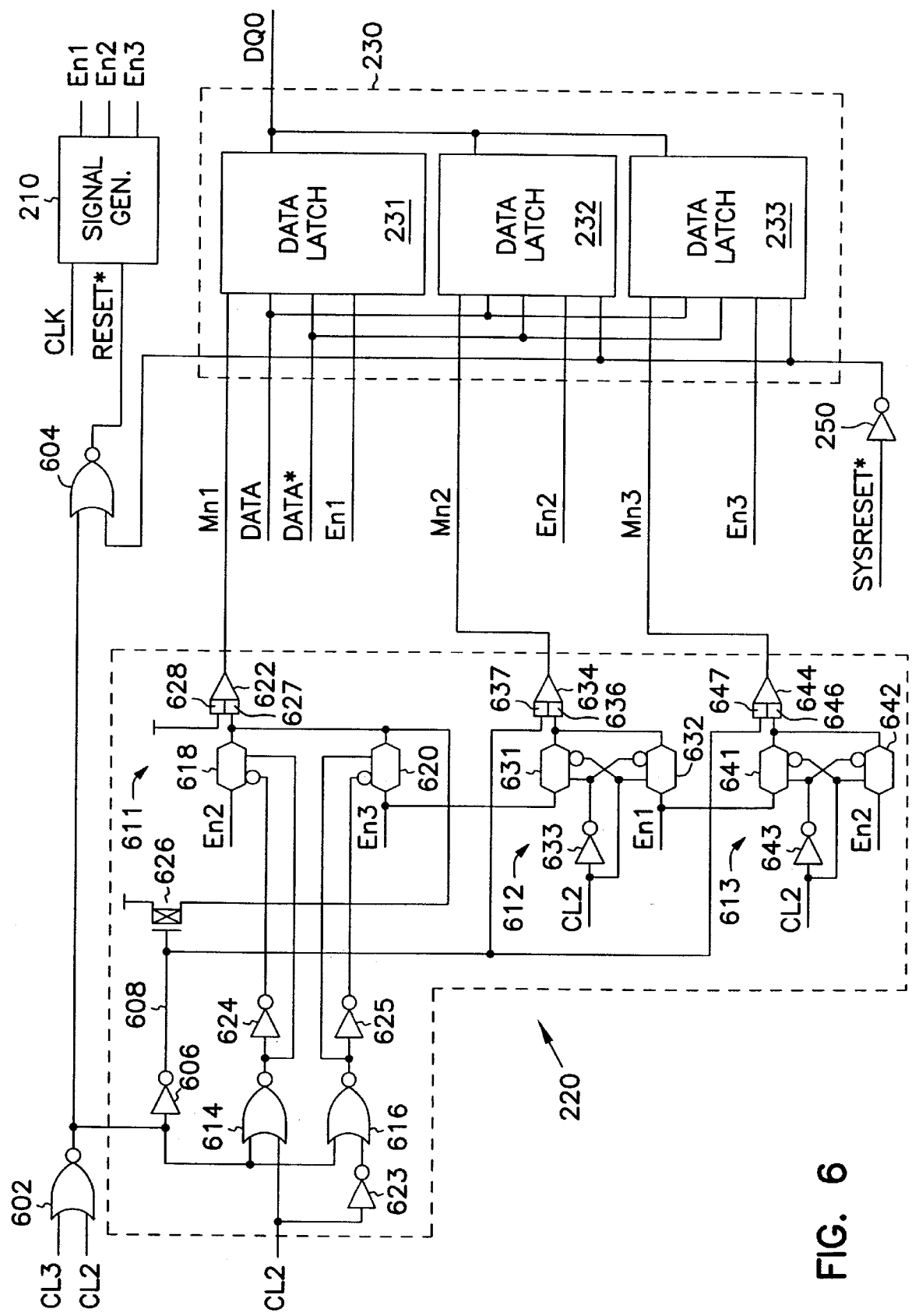
FIG. 6 is a schematic representation of the data output multiplexing control circuit provided by the invention.

Referring now to FIGS. 2 and 6, the data output multiplexing control circuit 220 includes a NOR gate 602 and a NOR gate 604 which provide for initialization of the data output multiplexing control circuit 220 and of the timing signal generator 210. NOR gate 602 has one input connected to receive signal CL2 and a further input connected to receive signal CL3. The output of NOR gate 602 is coupled through an inverter 606 to a node 608. Also, the output of NOR gate 602 is connected to one input of NOR gate 604, a second input of which is connected to receive the complement of the system reset signal SYSRESET* which is provided by an inverter 250. The output of NOR gate 604 is connected to the reset input of the three-phase timing signal generator 210.

The data output multiplexing control circuit 220 includes three enabling circuits 611, 612 and 613, each associated with a different one of the data latch circuits of the data output register circuits, such as data register circuits 231, 232 and 233 of output data register circuit 230. Enabling circuit 611 includes a NOR gate 614, a NOR gate 616, a multiplexer circuit 618, a multiplexer circuit 620, a delay circuit 622, inverters 623, 624 and 625, and a p-channel transistor 626. NOR gate 614 has one input connected to the output of the NOR gate 602 and a second input connected to receive signal CL2. The output of NOR gate 614 is connected to a control input of multiplexer circuit 618 and through inverter 624 to the complementary control input of the multiplexer circuit 618. Timing signal En2 is connected to the input of the multiplexer circuit 618. The output of the multiplexer circuit 618 is connected to an input 627 of the delay circuit 622. An enabling input 628 of the delay circuit is connected to Vcc so that the delay circuit 622 is maintained in an enabled condition whenever power is applied to the semiconductor SDRAM.

The delay circuit 622 comprises an RC circuit having two inputs to allow disabling control of the circuit. The input 627 delays on either the positive or negative edge of the applied signal. The enabling input 628 delays only on the positive edge of the applied signal and allows the delay circuit to be controlled. In the exemplary embodiment, this feature is used to disable the enabling circuits 612 and 613 when the data output multiplexing control circuits are programmed to provide a clock latency of one, as will be shown. Also, the gate electrode of the transistor 626 is connected to node 608 and the source-to-drain circuit of transistor 626 is connected between Vcc and input 627 of the delay circuit 622 so that delay circuit 622 is enabled irrespective of the timing signals En1–En3 as long as transistor 626 is conducting. For such conditions, all of the data retrieved from the memory array 22 or 24 and applied to read data lines DATA1 and DATA1* is passed through only one of the latch circuits 231 of the data output register circuit 230 prior to being transferred to data output DQ0. Similarly, data applied to read data lines DATA2–DATA8, and complementary data lines DATA2*–DATA8*, is passed through only one of the latch circuits of the associated data output register circuits prior to being transferred to data outputs DQ1–DQ7.

The NOR gate 616 has one input connected to the output of the NOR gate 602 and a second input connected to receive the complement of signal CL2 which is provided by inverter 623. The output of NOR gate 616 is connected to a control input of multiplexer circuit 620 and through inverter 625 to the complementary control input of the multiplexer circuit 620. The input of the multiplexer circuit 620 is connected to receive timing signal EN3. The output of the multiplexer circuit 620 is connected to input 627 of the delay circuit 622. The delay circuit 622 produces enabling signal Mn1 at the output thereof when either one of the timing signals En2 or En3 is passed by respective multiplexer circuits 618 or 620 to the delay circuit 622.

The enabling circuit 612 includes multiplexer circuits 631 and 632, an inverter 633 and a delay circuit 634. Signal CL2 is applied to one of the control input of the multiplexer circuit 632. The complement of signal CL2, which is produced by inverter 633, is applied to a control input of multiplexer circuit 631. Signal CL2 and its complement are connected to the complementary control inputs of the multiplexer circuits 631 and 632. Timing signal En3 is applied to the input of multiplexer circuit 631 and timing signal En1 is applied to the input of the multiplexer circuit 632. The outputs of the multiplexer circuits 631 and 632 are connected to an input 636 of the delay circuit 634 which has an enabling input 637 connected to node 608 at the output of inverter 606. Node 608 is at a logic low level, inhibiting the delay circuit 634 whenever both signals CL2 and CL3 are at a logic low level, indicating that the data output multiplexing control circuits of the memory system are operating with a clock latency of one. The delay circuit 634 produces enabling signal Mn2 at the output thereof when either one of the timing signals En3 or En1 is passed to the delay circuit 634 by respective multiplexer circuits 631 and 632.

The enabling circuit 613 includes multiplexer circuits 641 and 642, an inverter 643 and a delay circuit 644. Signal CL2 is applied to one of the control inputs of the multiplexer circuit 642 The complement of signal CL2, which is produced by inverter 643, is applied to one of the control inputs of multiplexer 641. Signal CL2 and its complement are applied to the complementary control inputs of the multiplexer circuits 641 and 642. Timing signal En1 is applied to the input of multiplexer circuit 641 and timing signal En2 is applied to the input of the multiplexer circuit 642. The outputs of the multiplexer circuits 641 and 642 are connected to an input 646 of the delay circuit 644 which has an enabling input 647 connected to node 608 at the output of inverter 606. Node 608 is at a logic low level, inhibiting the delay circuit 644 whenever both signals CL2 and CL3 are at a logic low level, indicating that the output multiplexing control circuits of the memory system is operating with a clock latency of one. The delay circuit 644 produces an enabling signal Mn3 at the output thereof when either one of the signal En1 or En2 is passed to the delay circuit 644 by respective multiplexer circuits 641 and 642.

When the data output multiplexing control circuits are programmed to provide a clock latency of two or three, the timing signals En1, En2 and En3 control the enabling circuits 611, 612 and 613 of the data output multiplexing circuits in controlling the flow of data retrieved from the SDRAM to the data outputs DQ0–DQ7. When the data output multiplexing circuits are programmed to provide a clock latency of two, there is delay of two system clock pulses following reset, before data is available on the data outputs. When the data output multiplexing circuits are programmed to provide a clock latency of three, there is a delay of three clock pulses before data is available on the data outputs. The latency select signals CL2 and CL3 are loaded into the general mode register 40 (FIG. 1), along with other operating parameters for the device, during the power-up procedure in the manner known in the art.

The enabling signals Mn1, Mn2 and Mn3 that are produced by the data output multiplexing circuits are used to load data into the data register circuits 231, 232 and 234, respectively. The timing signals En1, En2 and En3 are used to read the data from the data output register circuits 230–240. The outputs of the data latch circuits, such as data latch circuits 231, 232 and 233, which form the data output register circuits, such as data output register circuit 230 of the SDRAM 10, are commonly connected to the complementary data outputs, such as data output DQ0 for data output register circuit 230. For such purpose, each data output register circuit includes complementary latch stages, as is known.

The data lines DATA(n) and DATA(n)* are connected to data latch circuits of the data output register circuits 230–240 (FIG. 2). The complement of the system reset signal SYSRESET*, which is produced by inverter 250, is supplied to each of the latch circuits, such as latch circuits 231, 232 and 233, of the data output register circuits, for clearing the data output register circuits whenever necessary.

Operation of the Data output Multiplexing Control Circuit

Referring to FIG. 6, for the purpose of describing the operation of the data output multiplexing control circuit, it is assumed initially that the clock latency is set to provide a clock latency of one. For such condition, the signals CL2 and CL3 are both at a logic low level. Also, the description of the operation will be provided only with respect to the transfer of data applied to data lines DATA1 and DATA1* to data output DQ0, it being understood that the transfer of data applied to the other data lines DATA2–DATA8 and DATA2*–DATA8* is carried out in similar fashion and simultaneously with the data transfer operation for data appearing on the data lines DATA1 and DATA1*.

When the system reset signal SYSRESET* is provided, all of the data register circuits, including data register circuit 230, are cleared. Also, NOR gate 604 is disabled, causing its output to become a logic low level which resets the timing signal generator 210 in the manner that has been described.

For a clock latency of one, all of the data applied to the data lines DATA1 and DATA1* is passed through latch circuit 231 of data output register circuit 230. The signals CL2 and CL3, which are both at a logic low level, enable NOR gate 602 so that its output is a logic high level. The output of NOR gate 602, as inverted by inverter 606, is applied to the gate electrode of transistor 626, turning on transistor 626 which couples Vcc to the input 627 of the delay circuit 622. Also, the signal provided at the output of inverter 606 is applied to the delay circuits 634 and 640, disabling the delay circuits 634 and 640 to disable the passage of data to the data output register circuits 232 and 233. Accordingly, as each data bit is applied to the data line DATA1 and the complementary data line DATA1*, the data bits are gated into the complementary latches 234 and 235 of the data latch circuit 231, and independently of the timing signals En1–En3. The data bits are read from the data latch circuit 231 by the next timing signal En1.

Figure 7:
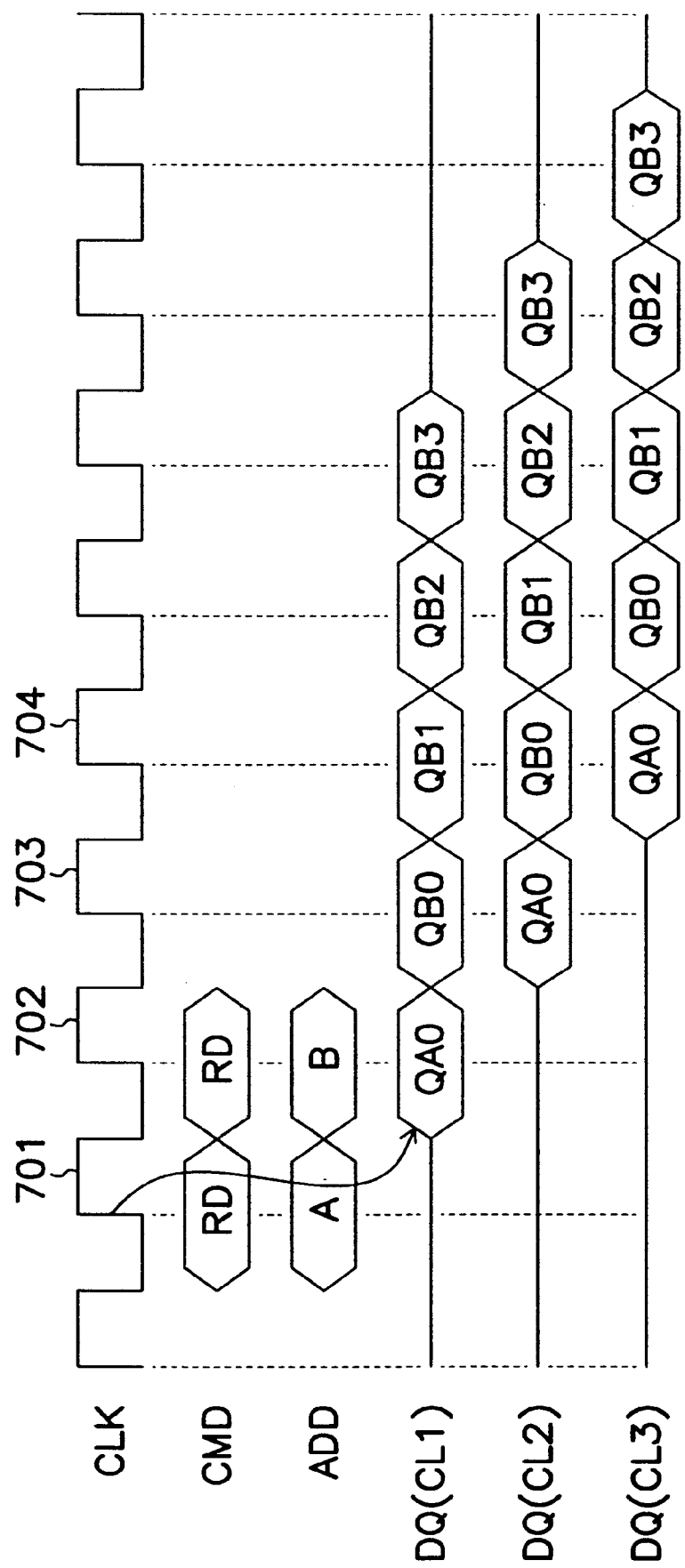
FIG. 7 is a timing diagram showing the relationship between the memory system clock pulses and the availability of the data bits for three levels of latency provided by the data output multiplexing control circuit provided by the invention.

Referring to FIG. 7, for a clock latency of one, the first data QAO is available in response to the first clock pulse 701 that is provided following the request for the data as represented by the read command RD and the receipt of the address A0.

When the data output multiplexing control circuit is programmed to provide a clock latency of two, the signal CL2 is set to a logic high level. For such condition, signal CL2 disables NOR gate 602, disabling transistor 626, to remove the enabling signal from input 627 of delay circuit 622 and removing the inhibit signal from the delay circuits 634 and 640. In addition, NOR gate 604 is disabled, generating a reset signal for the timing signal generator 210.

The logic low level provided at the output of the NOR gate 602 is applied to an input of NOR gate 614 and to an input of NOR gate 616. NOR gate 614 is held disabled by the signal CL2. However, NOR gate 616 is enabled by the complement of the signal CL2 provided by inverter 623. Accordingly, the output of NOR gate 614 is a logic low which inhibits the multiplexer circuit 618. The output of NOR gate 616 is at logic high level and together with its complement provided by inverter 625, enable multiplexer circuit 620 to gate the timing signal En3 to data register circuit 231 when this timing signal is produced by the timing signal generator 210. In addition, signal CL2 and its complement as produced by inverter 633, enable multiplexer circuit 632 to gate the timing signal En1 to data register circuit 232. Signal CL2 inhibits multiplexer circuit 631. Moreover, signal CL2 and its complement as produced by inverter 643, enable multiplexer circuit 642 to gate the timing signal En2 to data register circuit 233. Signal CL2 inhibits multiplexer circuit 641.

Consequently, the first data bits read from the memory array 22 or 24 and applied to data lines DATA1 and DATA1* are loaded into complementary data latches 232 when timing signal En1 is provided by the timing signal generator 210. The data that is loaded into the complementary data latches 232 is read from the data output register circuit 230 and applied to the data output DQ(x) by the next timing signal En2 that is produced by the timing signal generator.

The second data bits read from the memory array and applied to complementary data lines DATA1 and DATA1* are loaded into data latch 233 of the data output register circuit 230 by timing signal En2 and are read from the data output register circuit 230 and applied to the data output DQ0 by the next timing signal En3 that is produced by the timing signal generator.

The third data bits read from the memory array and applied to data lines DATA1 and DATA1* are loaded into the latch circuit 231 of the data output register circuit 230 in response to timing signal En3. This data is read from the data output register circuit 230 and applied to the data output DQ0 by the next occurrence of the timing signal En1.

Referring again to FIG. 7, for a clock latency of two, the first data QA0 is available in response to the second clock pulse 702 that is provided following the request for the data as represented by the read command RD and the receipt of the address.

The operation of the data output multiplexing control circuit 220 is similar when the data output multiplexing control circuit 220 is programmed to provide a clock latency of three. However, the first data is loaded into the data latch circuit 233 of the data output register circuit 230 in response to the first timing signal En1 and is read from the data register circuit 230 in response to the next occurrence of timing signal En3. Also, the second and third data bits are stored in data output latch circuits 231 and 232 by respective timing signals En2 and En3, and are read out by the next occurrences of timing signals En1 and En2, respectively.

Briefly, the signal CL3 is set to a logic high level when the data output multiplexing system is programmed to provide a clock latency of three. For this condition, signal CL3 disables NOR gate 602, removing the inhibit signal from the delay circuits 634 and 644 and disables the transistor 626, removing the enabling signal from the input of the delay circuit 622. The signal CL3 also disables NOR gate 604, generating a reset signal for the timing pulse generator 210.

The logic low level provided at the output of the NOR gate 602 is applied to an input of NOR gate 614 and to an input of NOR gate 616. NOR gate 614 is enabled by this signal because the signal CL2 is at logic low level. NOR gate 616 is disabled by the complement of signal CL2 produced by inverter 623. Accordingly, the output of NOR gate 614 is a logic high level which enables multiplexer circuit 618. The output of NOR gate 616 is at a logic high level and together with its complement provided by inverter 625, disables multiplexer circuit 620. In addition, the logic low state for signal CL2 and its complement provided by inverter, enable multiplexer circuit 631 to gate the timing signal En3 to data latch circuit 232. Signal CL2 inhibits multiplexer circuit 632. Moreover, the logic low state for signal CL2 and its complement provided by inverter 643, enable multiplexer circuit 641 to gate the timing signal En1 to data latch circuit 233. Signal CL2 inhibits multiplexer circuit 642.

Consequently, the first data bit that is read from the memory is loaded into data output latch circuit 233 when timing signal En1 is provided by the timing signal generator 210 and read from the data latch circuit and applied to the data output DQ0 by the next timing signal En3. The second data bit that is read from the memory is loaded into the data output latch circuit 231 by timing signal En2 and is read out by the next timing signal En1. The third data bit is loaded into the data latch circuit 232 in response to timing signal En3, and is read from the data latch circuit by the next signal En2.

In summary, the first data bit is loaded into data output latch circuit 233 by timing signal En1 and is read out by the next occurrence of timing signal En3. The second data bit is loaded into data output latch circuit 231 by timing signal En2 and is read out by the next occurrence of timing signal En1. The third data bit is loaded into data output latch circuit 232 and is read out by the next occurrence of timing signal En2. The three-phase timing signals En1, En2 and En3 control both the latching of the data into the data output register 32 and the application of the latched data to the data outputs DQ0–DQ7.

As is shown in FIG. 7, for a clock latency of three, the first data QA0 is available in response to the third clock pulse 703 that is provided following the request for the data as represented by the read command RD and the receipt of the address.

What is claimed is:

1. A multiplexing arrangement for transferring data retrieved from a memory array of a semiconductor memory to data outputs of the semiconductor memory, said multiplexing arrangement comprising:

a data output register coupled to the memory array, said data output register including a plurality of data storage circuits for storing data retrieved from the memory array;

a timing signal generator for generating a plurality of phased timing signals for reading data from said data storage circuits of said data output register; and a multiplexing circuit responsive to said phased timing signals for loading data retrieved from the memory array into said data storage circuits of said data output register;

wherein said phased timing signals cause the multiplexing circuit to load data into said data output register in a first predetermined sequence and cause the data stored in the data output register to be passed from the data output register to the data outputs in a second predetermined sequence.

2. A multiplexing arrangement for transferring data retrieved from a memory array of a semiconductor memory to data outputs of the semiconductor memory, said multiplexing arrangement comprising:

a data output register coupled to the memory array, said data output register including a plurality of data storage circuits for storing data retrieved from the memory array;

a timing signal generator for generating timing signals for reading data from said data storage circuits of said data output register in a first predetermined sequence to pass the data from the data output register to the data outputs;

a latency select circuit for providing a latency select signal for selecting a clock latency for the multiplexing arrangement; and a multiplexing circuit responsive to said timing signals and to said latency select signal for loading data retrieved from the memory array into said data storage circuits of said data output register in a second predetermined sequence that establishes a known delay between the time that data retrieved from the memory array is stored in said data output registers and the time that data stored in said data output registers is passed to the data outputs.

3. The multiplexing arrangement according to claim 2, wherein said multiplexing circuit includes a plurality of enabling circuits, each of said enabling circuits being individually associated with a different data storage circuit of said data output register, said enabling circuits being responsive to said latency select signal for controlling the sequence in which said timing signals are applied to said data storage circuits of said data output register to establish said second predetermined sequence in which data retrieved from the memory array is loaded into said data storage circuits of said data output register.

4. The multiplexing arrangement according to claim 3, wherein said latency select circuit is programmable to provide a clock latency for the multiplexing arrangement that is greater than one, said latency select signal inhibiting all but one of said enabling circuits when said latency select circuit is programmed for a clock latency of one, whereby data retrieved from the memory array is loaded only into the data storage circuit associated with said one enabling circuit.

5. The multiplexing arrangement according to claim 2, wherein said timing signal generator derives said plurality of timing signals from system clock pulses, and wherein said timing signal generator includes a latency control circuit responsive to the system clock pulses to provide a predetermined clock latency for the multiplexing arrangement.

6. The multiplexing arrangement according to claim 5, wherein said latency control circuit provides a clock latency of one for the multiplexing arrangement, and wherein said latency select circuit is programmable to provide a clock latency that is greater than one for the multiplexing arrangement.

7. A multiplexing arrangement for transferring data retrieved from a memory array of a semiconductor memory to data outputs of the semiconductor memory, said multiplexing arrangement comprising:

a data output register including a plurality of data storage circuits for storing data retrieved from the memory array;

a multiplexing circuit including a plurality of enabling circuits, each of said enabling circuits being individually associated with a different one of said data storage circuits for loading data retrieved from the memory array into the data storage circuits;

a latency select circuit for producing a select signal for indicating a clock latency selected for the multiplexing arrangement; and a timing signal generator for generating a sequence of timing signals for reading data from said data storage circuits in a first sequence;

and said enabling circuits being responsive to said select signal for selectively applying said timing signals to said data storage circuits in loading data retrieved from the memory array loaded into said data storage circuits, with a first one of said enabling circuits causing data retrieved from the memory array to be loaded only into a first one of said data storage circuits when a first clock latency is selected, and with said plurality of enabling circuits causing data retrieved from the memory array to be loaded into said data storage circuits in a second sequence that is different from said first sequence when a clock latency other than said first clock latency is selected.

8. The multiplexing arrangement according to claim 7, wherein said latency select signal controls said enabling circuits to cause first data to be loaded into one of said data storage circuits in response to a first one of said timing signals and to cause second data to be loaded into another one of said data storage circuits in response to a second one of said timing signals while said first data is being read from said one data storage circuits in response to said second timing signal, thereby providing a known delay from the time that said first data is retrieved from the memory array and is stored in said one data output register and the time said first data is passed to the data outputs of the semiconductor device.

9. The multiplexing arrangement according to claim 7, wherein said timing signal generator derives said timing signals from system clock signals, and wherein said timing signal generator includes a latency control circuit responsive to system clock pulses to provide a clock latency of one for the multiplexing arrangement.

10. A semiconductor memory comprising:

a memory array for storing data;

a memory readout circuit for retrieving data from the memory array during read cycles defined by a system clock;

a data output register coupled to the memory array for temporarily storing data that is retrieved from the memory array, said data output register including a plurality of data storage circuits;

a timing signal generator for deriving a plurality of timing signals from the system clock for reading data from said data output register;

a latency select circuit that is programmable to provide a plurality of clock latencies; and a multiplexing circuit for loading data retrieved from the memory array into said data output register, said multiplexing circuit being responsive to said latency select circuit, when programmed to provide a first clock latency, to apply a first one of the timing signals to a first one of said data storage circuits for loading data retrieved from the memory array into said first data storage circuit while further data previously retrieved from the memory array and loaded into second one of said data storage circuits is being read from said second data storage circuit in response to said first timing signal.

11. The semiconductor memory according to claim 10, wherein said multiplexing circuit includes inhibit means responsive to said latency select circuit, when said multiplexing means is programmed to provide a second clock latency different from said first clock latency, for causing the data retrieved from the memory array to be loaded into and read from a common one of said data storage circuits.

12. The semiconductor memory according to claim 10, wherein said timing signal generator comprises a multi-stage shift register connected for operation as a recirculating shift register; said shift register including a plurality of register stages for storing a predetermined pattern of bits, each register stage having a signal output, a drive circuit for producing bit pattern advance signals for advancing the bit pattern through said shift register to cause the bit pattern on the signal outputs of said register stages to change as the bit pattern is advanced through said shift register, and an output circuit for logically combining the signals provided on the signal outputs of said register stages as the bit pattern is advanced through said shift register.

13. The semiconductor memory according to claim 10, wherein said drive circuit is responsive to system clock pulses for producing said bit pattern advance signals for said shift register.

14. A timing signal generator, comprising:
a multi-stage shift register connected for operation as a recirculating shift register; said shift register including a plurality of register stages for storing a predetermined bit pattern, each of said register stages having complementary control inputs and a signal output;
a drive circuit responsive to system clock pulses for producing complementary bit pattern advance signals for application to said complementary control inputs of said register stages for advancing the bit pattern through said shift register to cause the bit pattern appearing on the signal outputs of said register stages to change as the bit pattern is advanced through said shift register; and
an output circuit coupled to said shift register for logically combining the signals provided on said signal outputs of said register stages as the bit pattern is advanced through said shift register for producing a sequence of timing signals.

15. The timing signal generator according to claim 14, wherein said output circuit comprises a plurality of logic gates having inputs connected to said signal outputs of said register stages, said logic gates being enabled in sequence as the bit pattern is circulated through said shift register.

16. The timing signal generator according to claim 14, wherein said drive circuit comprises a drive shift register including first and second drive register stages which store complementary bits, said drive shift register being responsive to successive system clock pulses to simultaneously change the states of the complementary bit pattern advance signals.

17. The timing signal generator according to claim 16, including a latency control circuit for absorbing the first system clock pulse thereby providing a clock latency of one for the system.

18. A method for transferring data retrieved from a memory array of a semiconductor memory to data outputs of the semiconductor memory, said method comprising:
providing a data output register having a plurality of data storage circuits;
producing a plurality of timing signals;
using a first one of the timing signals to load first data retrieved from the memory array into a first data storage circuit of the data output register;
using a second one of the timing signals to load second data retrieved from the memory array into a second data storage circuit of the data output register and to simultaneously read the first data from the first data storage circuit to thereby provide a known delay between the time that the first data retrieved from the memory array is loaded into the data output register and the time that the first data is available on the data outputs of the semiconductor memory.

19. A method according to claim 18, and including producing first and second latency control signals for use in applying the timing signals to the data storage circuits to thereby select the sequence in which data is loaded into the data storage circuits as a function of first and second clock latencies.

20. A method according to claim 19, and including using the first and second latency control signals to prevent said timing signals from loading data into said data output register and to cause data retrieved from the memory to be loaded into and read from only one of the data storage circuits of the data output register, thereby providing a third clock latency that is different from said first and second latencies.

* * * * *